United States Patent
Seidl et al.

(10) Patent No.: US 7,475,376 B2
(45) Date of Patent: Jan. 6, 2009

(54) METHOD AND SYSTEM FOR PERFORMING NON-LOCAL GEOMETRIC OPERATIONS FOR THE LAYOUT DESIGN OF A SEMICONDUCTOR DEVICE

(75) Inventors: Alexander Seidl, Munich (DE); Dirk Meyer, Essex (GB)

(73) Assignee: Qimonda AG, Munich (DE)

( * ) Notice: Subject to any disclaimer, the term of this patent is extended or adjusted under 35 U.S.C. 154(b) by 263 days.

(21) Appl. No.: 11/448,168

(22) Filed: Jun. 6, 2006

(65) Prior Publication Data

US 2007/0011636 A1    Jan. 11, 2007

(30) Foreign Application Priority Data

Jun. 6, 2005    (DE)    ........................ 10 2005 026 936

(51) Int. Cl.
*G06F 17/50*    (2006.01)

(52) U.S. Cl. ........................................................ 716/10

(58) Field of Classification Search ................. 716/4–5, 716/8–10, 19
See application file for complete search history.

(56) References Cited

U.S. PATENT DOCUMENTS

| | | | |
|---|---|---|---|
| 5,481,473 A | * | 1/1996 | Kim et al. ........................ 716/5 |
| 5,519,628 A | * | 5/1996 | Russell et al. .................. 716/10 |
| 5,528,508 A | | 6/1996 | Russell et al. |
| 5,559,718 A | | 9/1996 | Baisuck et al. |
| 6,009,250 A | * | 12/1999 | Ho et al. ......................... 716/5 |
| 6,009,251 A | * | 12/1999 | Ho et al. ......................... 716/5 |
| 6,011,911 A | * | 1/2000 | Ho et al. ......................... 716/5 |

OTHER PUBLICATIONS

Hedenstierna, N., et al., "The Use of Inverse Layout Trees for Hierarchical Design Rule Checking," 26th ACM/IEEE Design Automation Conference (1989) pp. 508-512.
Hedenstierna, N., et al., "The Use of Inverse Layout Trees for Hierarchical Design Verfication," IEEE (1988) pp. 534-537.
Hedenstierna, N., et al., "The Halo Algorithm—An Algorithm for Hierarchical Design of Rule Checking of VLSI Circuits," IEEE Transactions on Computer-Aided Design of Integrated Circuits and Systems, vol. 12, No. 2 (Feb. 1993) pp. 265-272.

* cited by examiner

*Primary Examiner*—Stacy A Whitmore
(74) *Attorney, Agent, or Firm*—Slater & Matsil, L.L.P.

(57) ABSTRACT

In one embodiment, an automatic check is performed to determine if the output of a parent region is compatible with the output of a current region of a cell. If the output of the parent region is compatible with the output of the current region of a cell, the output of the parent region is reduced (e.g., an ANDNOT operation) taking into account the current region. If the output of the parent region is not compatible with the output of the current region of a cell, the incompatible output of the sub-region is copied to a promote container and the incompatible output is promoted to the output of all other parent regions. These steps are performed for all parent regions. The layout hierarchy is first generated from the input data, and then is also generated from the region data. The difference between the layout hierarchy generated from the input data and the layout hierarchy generated from the region data is determined.

14 Claims, 11 Drawing Sheets

| Region 0 in Cell B | |
|---|---|
| Output | Shape0 |
| Promote | |

METHOD AND SYSTEM FOR PERFORMING NON-LOCAL GEOMETRIC OPERATIONS FOR THE LAYOUT DESIGN OF A SEMICONDUCTOR DEVICE

This application claims priority to German Patent Application 10 2005 026 936.2 which was filed Jun. 6, 2005, and is incorporated herein by reference.

TECHNICAL FIELD

The present invention relates generally to semiconductor devices, and in a particular embodiment to a method and system for performing non-local geometric operations for the layout design of a semiconductor device.

BACKGROUND

For the design of an integrated circuit or a structure in semiconductor technology (generally termed "layout") the verification of each element within a layout against design rules is of great importance. The design rules define the conditions that are, for example, necessary for a successful manufacturing of semiconductor devices. Basic definitions of the terms used in the following description are found, for example, in U.S. Pat. No. 5,528,508, which is incorporated herein by reference.

In the layout of integrated circuits or the layout of other structures of semiconductor devices the design rule checks (DRC) or similar operations can be divided into two classes:

1. Local operations: The results can be computed by taking local interactions between shapes into account. Shapes in this context are understood to be geometric forms representing structures or a part of a structure in the layout. Shapes in particular can be geometric primitives such as boxes, wires or polygons.

A local interaction here means that the interaction is limited by the range (distance). Examples of such local operations are: Geometric operations as Boolean Operators (AND, ANDNOT, XOR), spacing checks and distance checks or the placing of elements for an Optical Proximity Correction (OPC). An example for a spacing check would be, for example, that a rule requires that the space between two metal edges is not below a certain value; otherwise a short circuit might occur.

2. Non-local Operations: The results can be computed by taking into account closed regions (also termed as groups) of interacting shapes. The determination of the area of hierarchically distributed mask polygons is an example for such a non-local operation.

Layout data for a design is commonly structured in a hierarchy of cells since such a structure in general is computationally easier to handle than a flat structure. Each cell in this context may contain shapes, i.e., geometric forms forming the structure of the actual layout, or other cells referred to as subcells or child cells. The cell containing the subcell is then also referred to as parent cell to the subcell.

One cell may occur several times in a layout, the occurrences of the cell in the layout being referred to as instances of the cell.

In a flat design rule checking tool, each subcell of a layout is replaced by a copy of the referenced cell to produce a flat layout containing only shapes, i.e., geometric forms. The resulting data structure is large and, therefore, can be handled only in a computationally expensive manner.

A hierarchical design rule checking tool on the other hand performs the design rule check directly on the hierarchical data structure of the layout. This allows a computationally efficient handling, but design rule check tools are more complicated to implement.

Hierarchical, physical verification tools of layouts (e.g., Assura by Cadence and Calibre by Mentor Graphics) differ in their computational time, the data volume for intermediate results and end results and in the representation of the results in the cell hierarchy. This influences the assessment of the results by the layout designers. The methods used for the processing of the hierarchy herein have a decisive influence on the mentioned aspects, i.e., the computation time and the data volume to be kept in storage.

An inefficient hierarchy processing may, for example, lead to longer design times for a DRC in the layout design or for simulation based OPC.

From the following references, each of which is incorporated herein by reference, it is known to use methods involving "Inverse Layout Trees," (ILT) to collect and process the hierarchical shape and cell interactions for a layout and to represent the results in a layout hierarchy:

Hedenstierna, Jeppson, "The use of inverse layout trees of hierarchial design rule checking," 26th ACM/IEEE Design Automation Conference, 1989.

Hedenstierna, Jeppson, "The use of inverse layout trees for hierarchical design verification," Proceedings of ICCAD-88, Santa Clara, pp. 534-537, November 1988.

Hedenstierna, Jeppson, "The Halo Algorithm—An algorithm for hierarchical design rule checking of VLSI circuits," IEEE Transactions of Computer Aided Design of Integrated Circuits and System, Vol. 12, No. 2, February 1993.

U.S. Pat. No. 5,528,508 discloses a method that additionally uses a counter for instances for that purpose.

U.S. Pat. No. 5,559,718 describes a method in which a processing unit is coupled to a verification database. The result register has an input and an output, whereby the input of the result register is coupled to the output of a processing unit. The processing unit can override individual results.

SUMMARY OF THE INVENTION

Embodiments of the present invention are concerned with a method and a system in which layout data for non-local operations can be efficiently processed in a hierarchical way.

In one embodiment, an automatic check is performed to determine if the output of a parent region is compatible with the output of a current region of a cell. If the output of the parent region is compatible with the output of the current region of a cell, the output of the parent region is reduced (e.g., an ANDNOT operation) taking into account the current region. If the output of the parent region is not compatible with the output of the current region of a cell, the incompatible output of the sub-region is copied to a promote container and the incompatible output is promoted to the output of all other parent regions. These steps are performed for all parent regions. The layout hierarchy is first generated from the input data, and then is also generated from the region data. The difference between the layout hierarchy generated from the input data and the layout hierarchy generated from the region data is determined.

In the region hierarchy orphan cells are missing. By generating the difference between the region hierarchy and the input hierarchy, the orphan cells can be identified and can be processed further.

Embodiments of the invention have the advantage that memory requirements are reduced. Furthermore, embodiments of the invention can be used in parallel processing since there is no coupling between the input and the output of the processing unit. The results can be directly converted into a data forma (e.g., GDSII) for further processing without requiring a so-called override resolution, which can be required in other approaches.

One aspect in this respect is that the results that are stored/output for regions in sub-cells are compatible with the results that are stored/outputted for regions in parent cells. The problem has similarities with operations in hierarchical nets, especially if such operations use layout data (e.g., so-called antenna check).

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
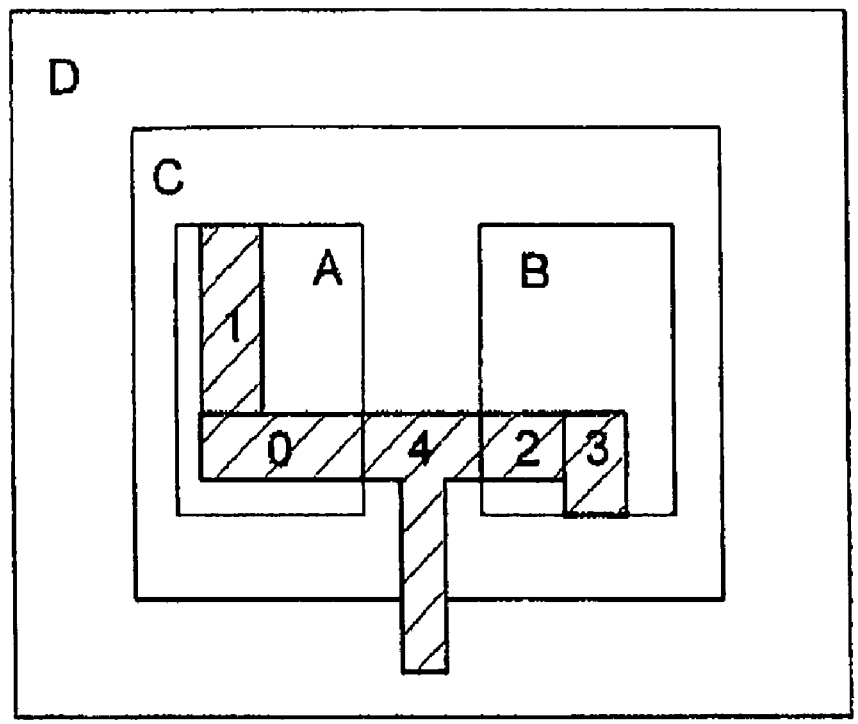
FIG. 1A schematically shows an example of a hierarchical structure of four cells.
Figure 1B:
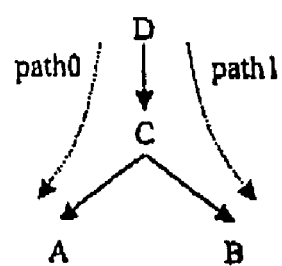
FIG. 1B shows a layout-tree for the example in FIG. 1A.

In FIG. 1A the placement of hierarchical cells A, B, C, D is depicted in a schematical way. CellA and CellB are sub-cells to CellC, which in turn is sub-cell of CellD (see also FIG. 1B). These cells are, e.g., cells in the layout for a semiconductor device, such as a DRAM chip or a microprocessor.

The embodiments of the present invention are applicable to structures like these. Typically, an embodiment of the method of the invention is software on a computer system.

In FIG. 1A five shapes are depicted as hatched area, i.e., Shape0, Shape1, Shape2, Shape3 and Shape4 .

CellD comprises Shape4. CellC does not comprise any shape.

Therefore, the following region graph can be constructed:

| CellD: | Region2: | Shapes: | Shape4 |
| | | Sub-Region: | (Path0, Region0), |
| | | | (Path1, Region1) |
| CellC: | — | | |
| CellA: | Region0: | Shapes: | Shape0, Shape 1 |
| | | Sub-Region: | — |
| CellB: | Region1: | Shapes: | Shape2, Shape3 |
| | | Sub-Region: | — |

Regions are groups of shapes in the hierarchy. Grouping is defined by a local predicate like "touching" or "overlap," which acts in a transitive way. In an example it can be said if ShapeA and ShapeB touch each other, they belong to a region. The same is true if ShapeB touches a ShapeC. Due to the transitivity ShapeA and ShapeC, they belong to a region. In total, all three shapes belong to the same region.

Embodiments of the invention employ the concept of "output promotion" for sub-regions, i.e., the upward shifting of Shapes in the hierarchy if that is found necessary. This will be explained in more detail below.

Using this concept, a sub-region output, which is not compatible with a given parent region (i.e., which is not compatible with the layout hierarchy), is moved "out of the way."

This is achieved by shifting all incompatible output shapes from the sub-region into all referencing parent regions, as far as these are known at that time.

This "promoting" procedure does not affect the flattened output of other parent regions.

For each region a set of links to parent regions referencing the given region are stored. These links are used to shift the "interferring" output-shapes upwards in the hierarchy ("promoting").

Only those results for sub-regions are shifted to the output of the parent regions, which are not compatible with the results for the parent region. To this effect a list (set) of links is determined comprising all parent regions that reference this region.

The results are determined in a bottom-up run over the cell hierarchy, whereby incompatible results for sub-regions are shifted towards the output (results) for compatible parent instances.

In a post-processing step, the hierarchical locations are determined to which the output of (sub)regions is directed. For this the inverse layout tree (ILT) is used, which is described in the article of Hedensierna, Jeppson, "The use of inverse layout trees for hierarchical design rule checking."

In summary, a selective shifting of output from sub-regions to parent regions is performed, whereby the parent regions can reference sub-regions in indirect sub-cells directly. A post-processing step is also performed using ILTs for the determination of the locations in which the output of regions, which are not referenced for all parent instances of parent regions.

A number of advantages can be realized by various embodiments of the invention: results that are computed for sub-regions can be directly used for the computation of results for a parent region, which might depend on the application. No geometric lookup taking into account of overrides is necessary; no shifting of sub-regions into parent regions is necessary to solve the problem of hierarchical compatibility of results for sub-regions with parent regions; embodiments of the invention can be extended to partially computed sub/parent region structures, if all sub-regions are determined before their parent region (but not all parent regions of a sub-region); and embodiments of the invention allow the parallization of the computation for individual regions (in bottom-up cell direction), if the shifting because of incompatible results is synchronized.

The "promotion" is described in connection with the following figures. Naturally, the following example is simplified to show the effect of the embodiment of the current invention. A person skilled in the art will recognize that the same principles will be applicable to much more complex structures.

Figure 2A:
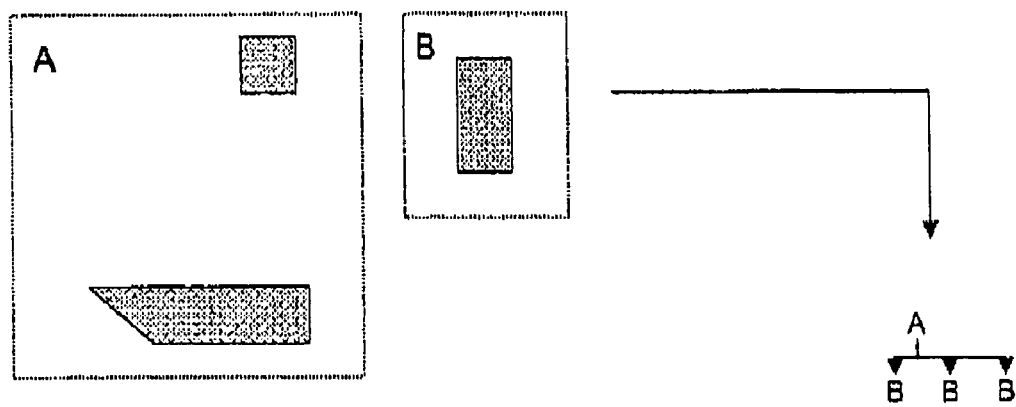
FIG. 2A schematically shows an example with two cells A and B.

FIG. 2A schematically shows two cells, CellA and CellB. The cell boundaries are depicted by dotted lines. The input for the method is indicated by the hatched areas.

Figure 2B:
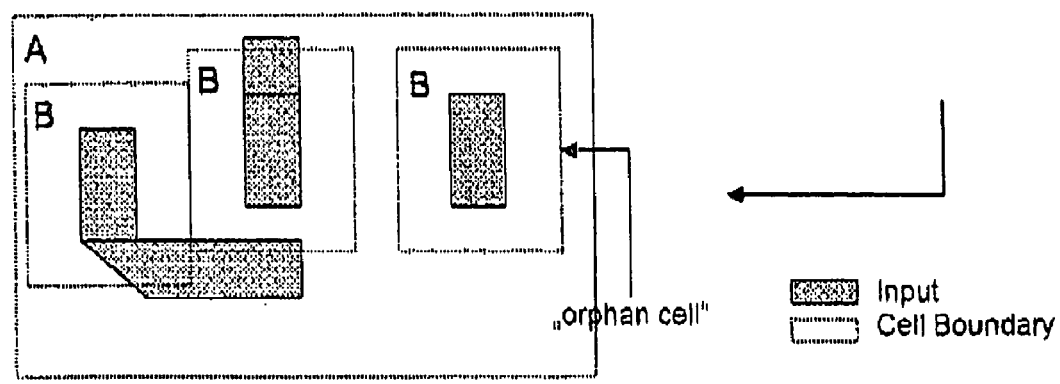
FIGS. 2B to 2H schematically show the steps for the processing of the example according to FIG. 2A.

CellA comprises two different input shapes, CellB comprises one input shape. The inputs are combined as indicated in FIG. 2B. There are three instances of CellB in CellA.

Within CellA two combined input shapes are formed (see FIG. 2B). The right instance of CellB in CellA as depicted in FIG. 2B is an orphan cell. The hierarchical tree for this is indicated between the arrows symbolizing the step from FIG. 2A to FIG. 2B.

Figure 2C:
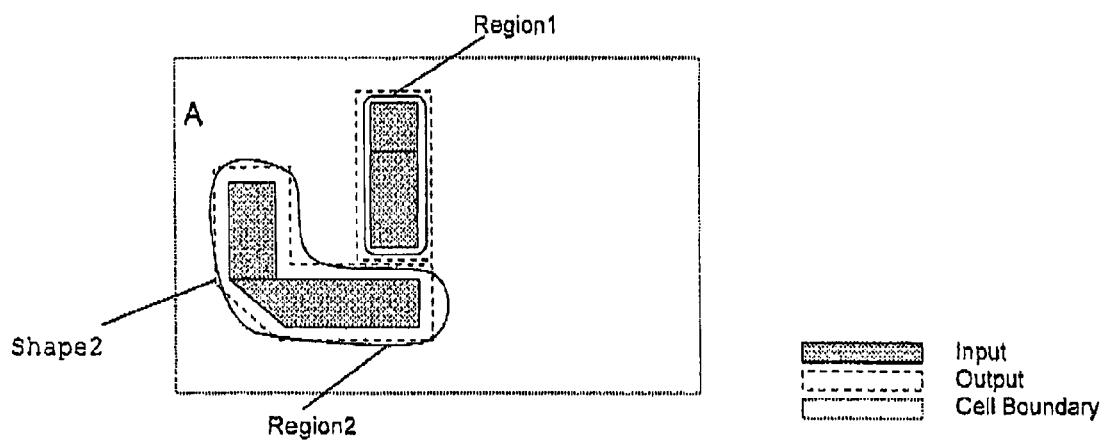

FIG. 2C shows output in CellA according to an embodiment of the invention. Output in orphan CellB stays in CellB at this stage of the algorithm, i.e., before orphan cell treatment, and is consequently not shown in FIG. 2C.

The output is demonstrated for shapes after a sizing procedure (i.e., shifting the boundaries of the input shapes by a predetermined value outwards resulting in an enlargement) is indicated by the dashed lines, i.e., the output shapes are represented by dashed lines.

It is important to note, that viewed from a top cell the "flattened" output data of a hierarchical method yields the same results as a method operating on flattened input data.

In FIG. 2C, regions (Region1, Region2) are formed by the combination of the shapes. The regions are indicated by solid lines in FIG. 2C.

Figures 2D, 2E:
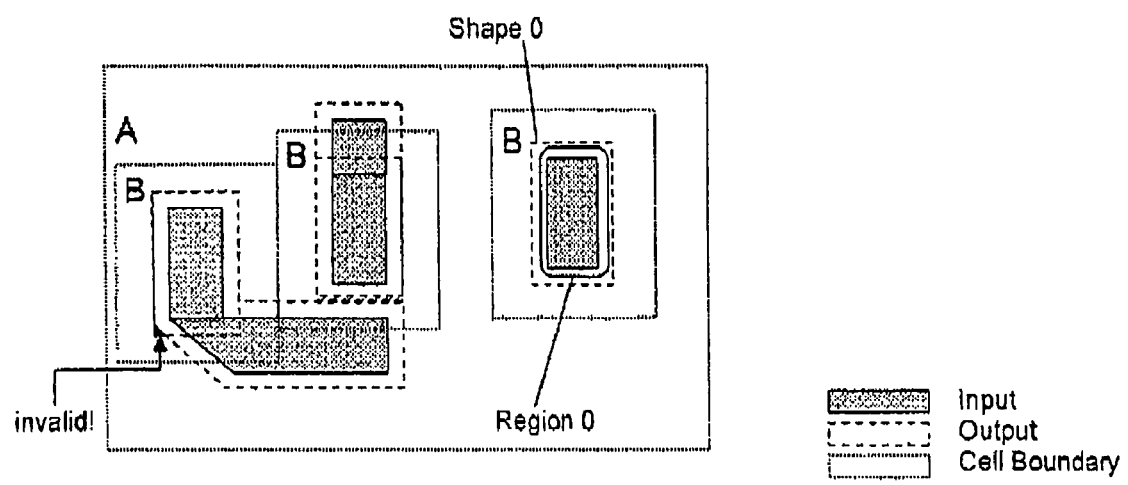
Figure 2F:
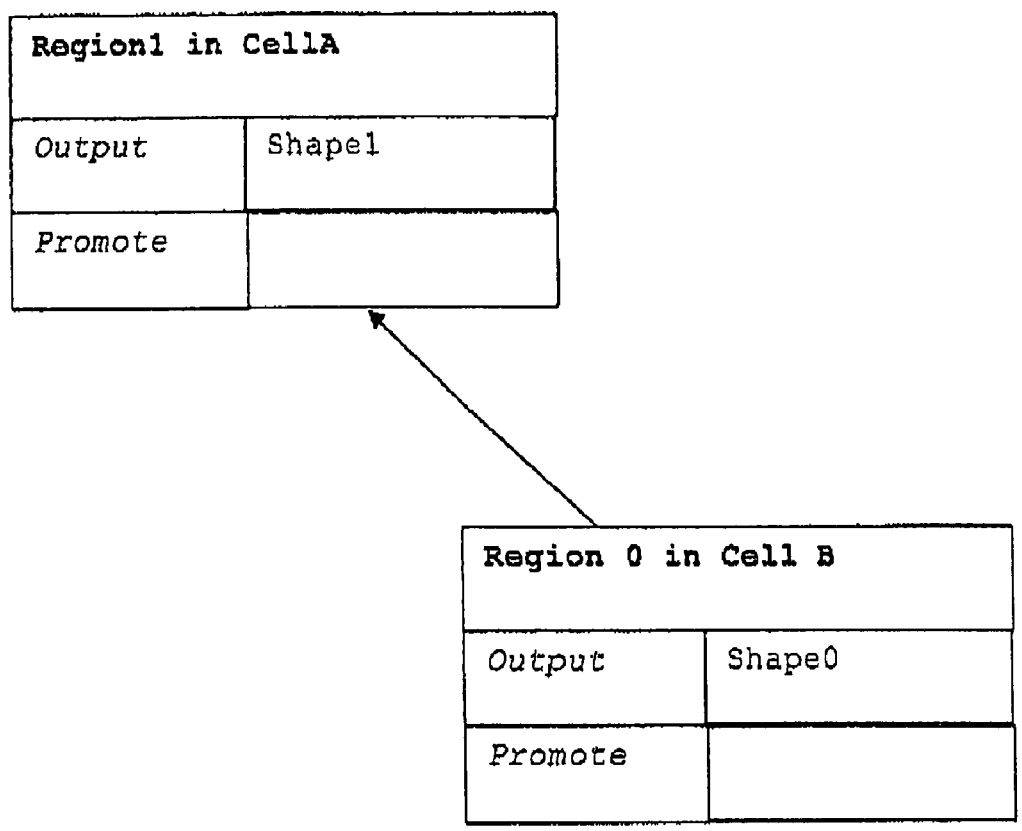

In FIG. 2D it is indicated that the overlapping output area of Shape0 and Shape2 results in an "invalid" corner, which is an unwanted result. In the example of FIG. 2D, Shape0 has to be removed from the output of Region2. Instead, an approximately L-shaped Shape2 will be written into the output.

The flattened output of the hierarchical operation is different from the output on the flattened (input) data and, therefore, invalid. On mask level, the result of the hierarchical operation is not equal to the result of the flattened out operation and, therefore, invalid. Those errors can be avoided by embodiments of the current invention.

The following steps (FIGS. 2E to 2H) are demonstrated with graphical representation for memory storages for the output and the promoted shape. The promotion can be understood as some kind of intermediate storage to save some information for a different level in the hierarchy. In the description of FIGS. 2E to 2H reference is made to the flowchart depicting an embodiment of the method given in FIG. 4.

In the first step (FIG. 2E), the output shape for the rectangular Shape0 in CellB (Region0) is computed. This is indicated in FIG. 2E by filling in the output memory with the data "Shapeo".

In the second step (FIG. 2F), the output shape for Region1 in CellA is computed. Since Shape0 is not incompatible (e.g., the sizing does not result in a conflict) with the output of Region1, the embodiment of the method can only define the parts of the output polygon that are not represented by Shape0. Therefore, Shape1 is stored as output for Region1 in CellA.

Figure 4:
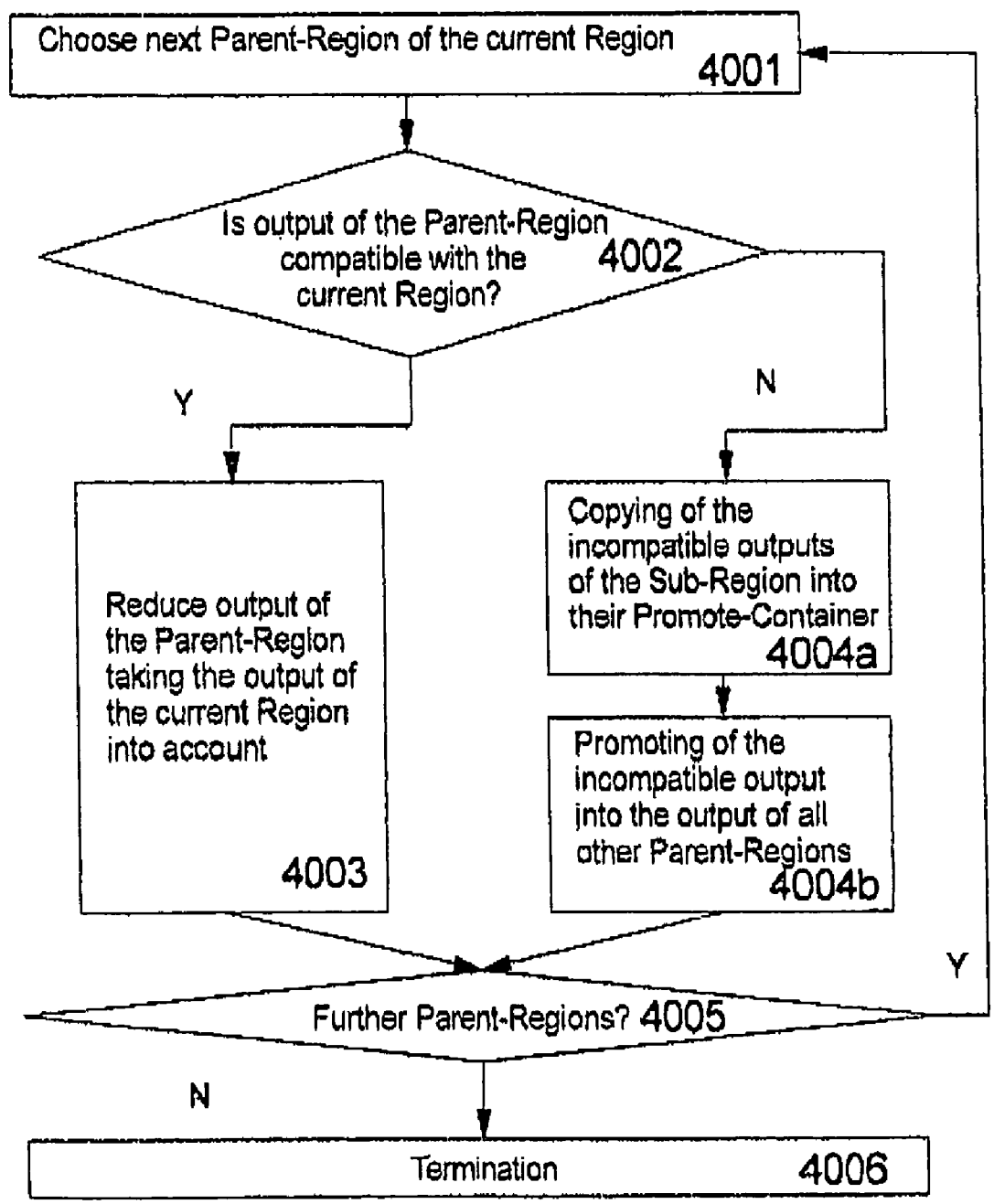
FIG. 4 shows the flow chart for a selective shifting ("promotion")

This second step (FIG. 2F) is equivalent to process steps 4002 and 4003 in FIG. 4 applied to Region1. There are further parent regions (Step 4005 in FIG. 4), so the procedure returns to process step 4001.

Figure 2G:
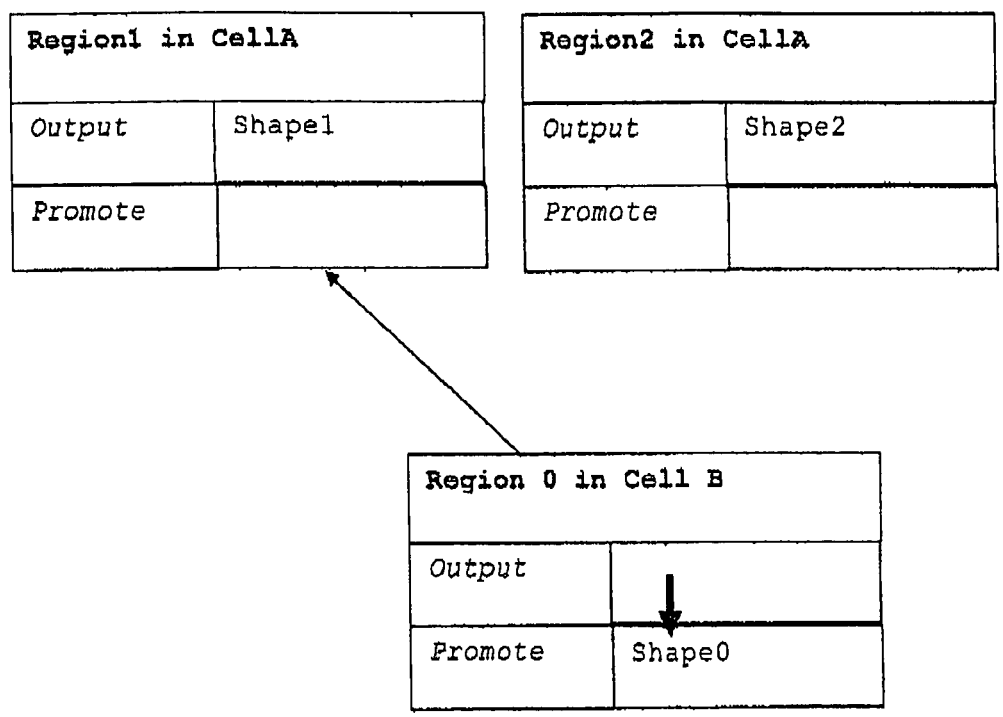

In the third step (FIG. 2G, corresponding to the status in FIG. 2C), the output for Region2 in CellA is computed. Here, Shape0 causes an incompatibility for the output of Region2 (see also FIG. 2D). Therefore, Shape0 will be marked in the "promote container" (i.e., a special memory position), i.e., Shape0 is effectively removed from the output of Region0, Region1 and Region2. In FIG. 2G this is indicated by moving Shape0 from the output of Region0 to the promote container. This third step (FIG. 2G) is an example for the process steps 4002 and 4004a in FIG. 4.

Shape0 is still required for Region1. In the fourth step (FIG. 2H, corresponding to the status in FIG. 2D, terminal status), Shape0 is stored in the output of the Region1, i.e., it is promoted. This fourth step is an example for the process steps 4004b in FIG. 4.

When the embodiment of the method has been evaluated for all regions, the results of the "output container," the output of the regions are stored in a data set.

Apart from the shifting of the sub-region shapes it is also necessary to instantiate the shapes in the promote container for all parent instances of the regions, which are not covered by the parent regions.

This step is made complex since a direct parent region might be located several levels above. Therefore, a post-processing step is necessary to complete the output.

The post-processing step uses an inverse layout tree (ILT) to find all instances of the parent cell in which the promote shapes have to be instantiated. The following pseudo code is used for that purpose.

The (*) indicates which parent instances are not covered by the parent regions, whereas the position in the layout hierarchy can be derived from the cell instantiation information that is available at that moment.

```
func findParentInstances( region )
        create empty iltNode
        for each parentRegion of region do
                bottomUpPath = path from region's cell to
                                    parentRegion's – cell instance
    iltNode.insertParentsAlongPath(bottomUpPath )
                done
    determineParents( iltNode )
    end
    func determineParents( iltNode )
            if iltNode is not leaf then
                    for each parentCellInst of cell do
                        if corresponding parent branch in iltNode then
                            determineParents(corresponding parent of
                                    iltNode)
                            else
                                        (*) // found required parent inst
                        endif
            done
    endif
    end
```

Figure 3:
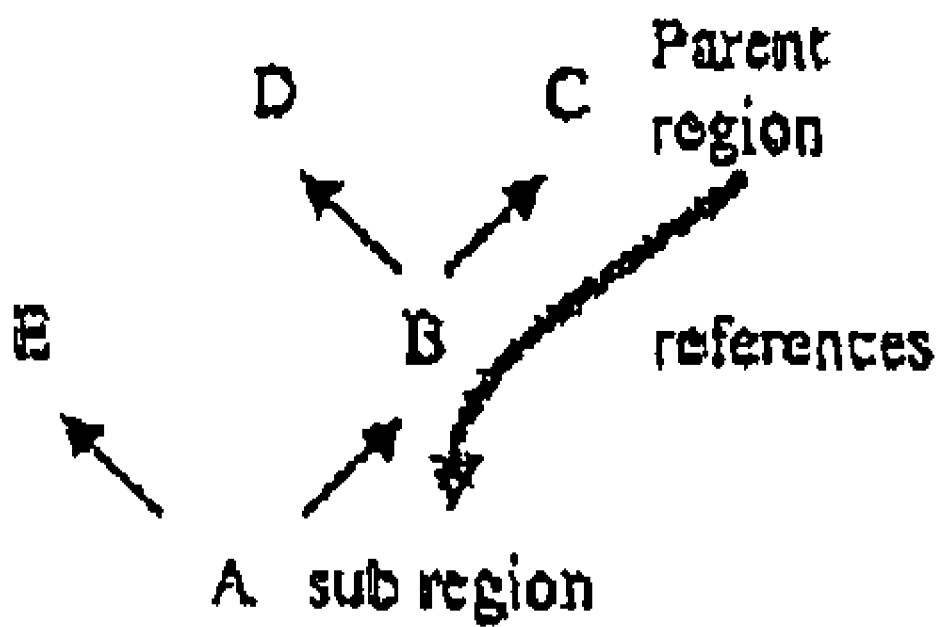
FIG. 3 schematically shows the processing of an ILT.

In FIG. 3 another example using Cells A, B, C, D, E is depicted in a tree format. Using this example an embodiment of the invention is described in connection with FIGS. 4 to 6.

FIG. 4 shows a flow chart for a procedure that is executed for all regions of a cell, the cells being processed from bottom-up.

Figure 2H:
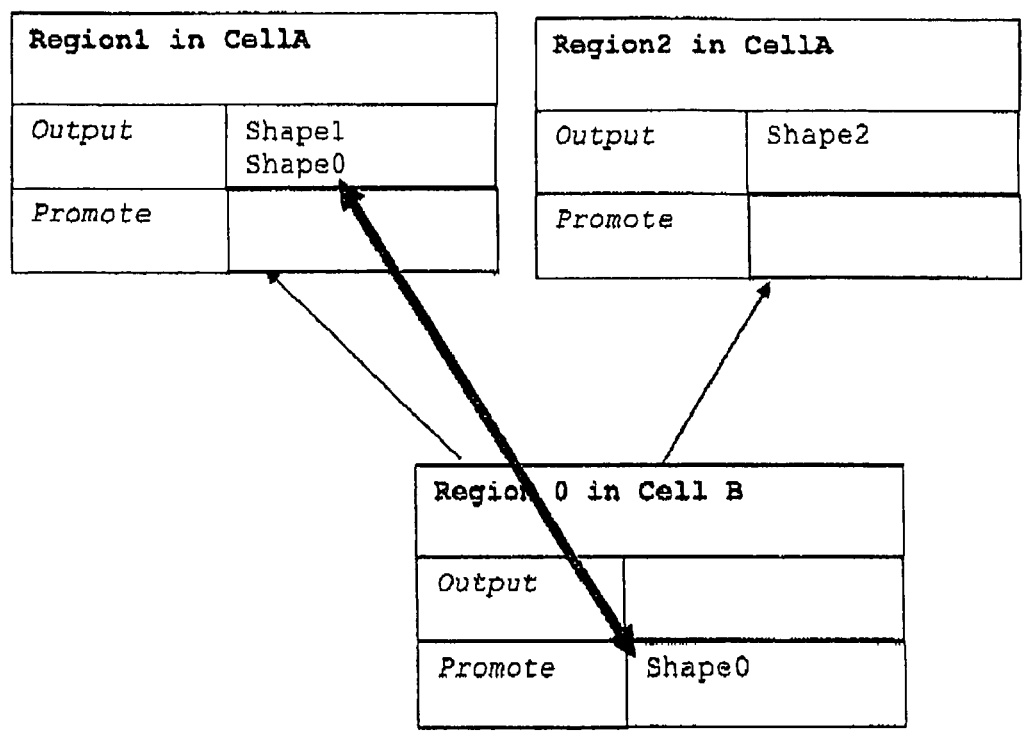

Step 4005 represents the shifting of the output shapes into the output container, which has been shown in FIG. 2H.

Figure 5:
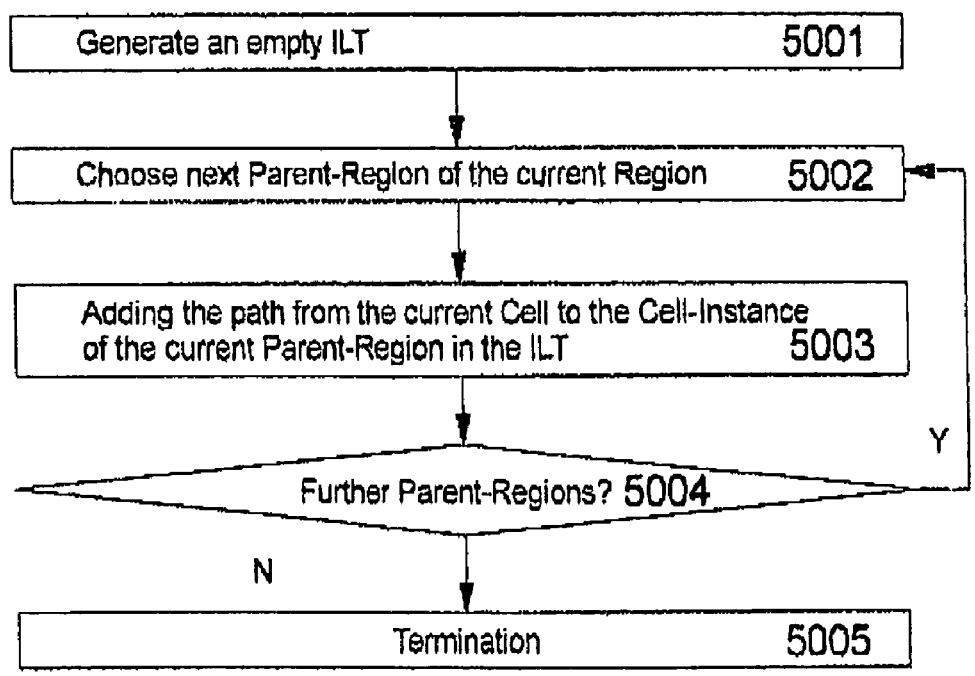
FIG. 5 shows the flow chart for the computation of an ILT.

In FIG. 5 a flowchart for an ILT is described. The concept of an ILT is known as such, e.g., from the above cited references.

In process step 5001 it is stated with an assumed region in CellA and an empty ILT is generated for this region.

CellA has a parent region via the instancing path B-C (process step 5002); see FIG. 3.

The instancing path A-B-C is included into the ILT (process step 5003).

There are no further parent regions in the example of FIG. 3.

The ILT contains only branches, which were included, i.e., A has a branch for parent instance B in A, B has a branch for parent instance C in B.

Figure 6:
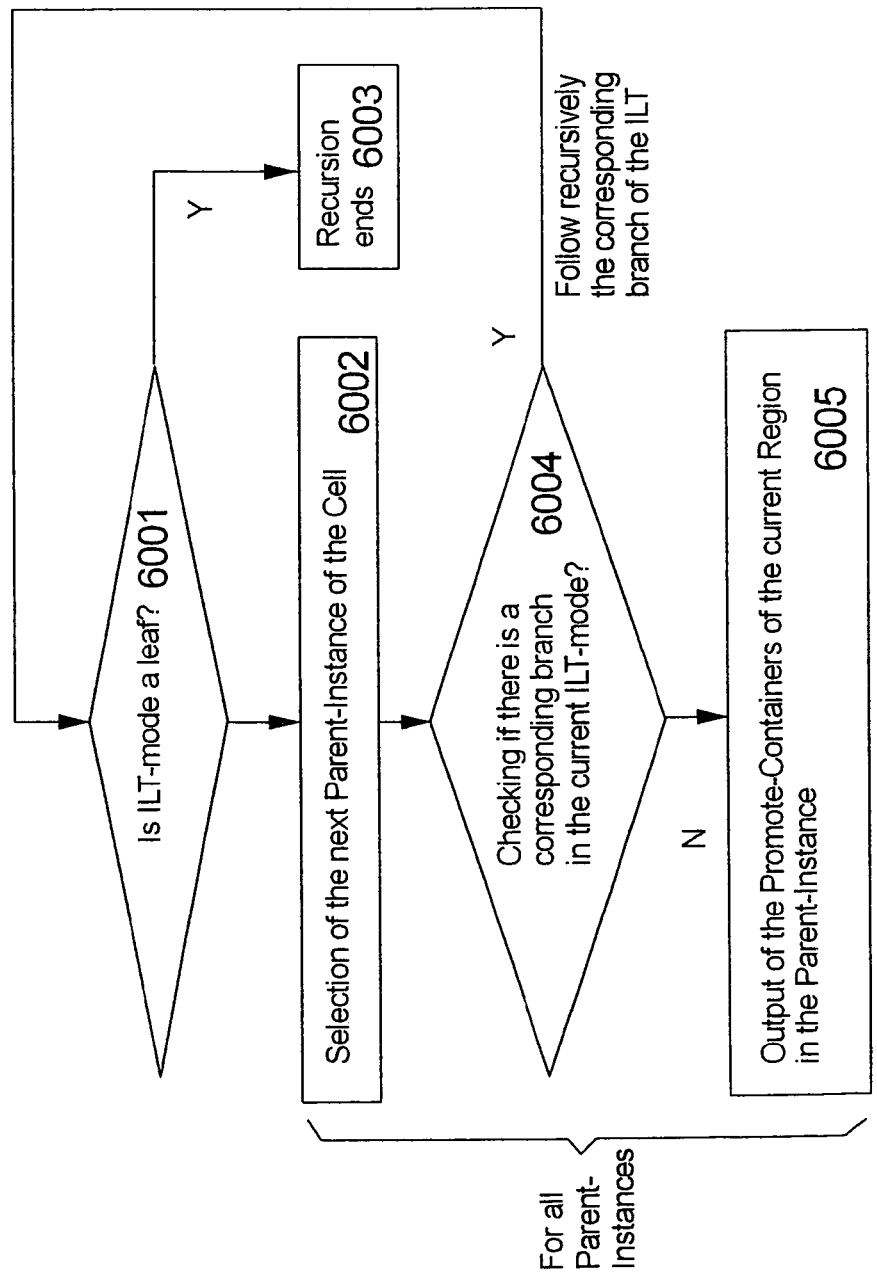
FIG. 6 shows the flow chart for the result output.

In FIG. 6 the output of the results, including the "promotion" is described. Starting point is the root of the ILT for the cell. The root in the example of FIG. 3 is no leaf of the ILT since the root has a branch for parent Instance B (process step 6001)

The first parent instance of A is E (process step 6002)

In the next process step 6004, it is found that there is no respective branch in the ILT.

According to process step 6005 the content of the promote container is output in instance E.

As shown in FIG. 6, process steps 6002, 6004 and 6005 are executed for all parent instances.

The next parent instance of A is B (process step 6002).

There is a branch for B in the ILT (process step 6004).

B is no leaf in the ILT since it contains a branch for parent instance C (process step 6001).

These process steps are then to be repeated respectively for the cells B and D.

The invention is not limited to the described embodiments. A person skilled in the art will recognize that a number of variants are possible that make use of the inventive method and the inventive system in different embodiments.

What is claimed is:

1. A method for generating a layout for a semiconductor device, the method comprising:
    for all parent regions, determining if an output of the parent region is compatible with an output of a current region of a cell,
        when the output of the parent region is compatible with the output of the current region of a cell, reducing the output of the parent region taking into account the current region; or
        when the output of the parent region is not compatible with the output of the current region of a cell, copying an incompatible output of a sub-region to a promote container and promoting the incompatible output to an output of all other parent regions;
    generating a layout hierarchy from input data;
    generating a layout hierarchy from region data, wherein the layout hierarchy from the input data and the layout hierarchy from the region data are determined using an inverse layout tree (ILT); and
    determining a difference between the layout hierarchy generated from the input data and the layout hierarchy generated from the region data;
    the method further comprising:
    generating an empty ILT;
    for all parent regions, choosing a next parent region of a current region and adding a path from a current cell to a cell-instance of the current parent region in the ILT;
    checking if an ILT-node is a leaf and, if the ILT-node is a leaf, ending the recursion;
    when the ILT-node is not a leaf, selecting a next parent instance of the cell and checking if there is a corresponding branch in the current ILT-Node, and if there is a corresponding branch, recursively following the corresponding ILT branch; and
    when there is no corresponding branch in the current ILT-Node, generating an output of the promote containers of the current region in the parent instance;
    wherein the layout can be used in the fabrication of a semiconductor device.

2. The method according to claim 1, wherein the layout hierarchy from the input data is generated before the layout hierarchy from the region data.

3. The method according to claim 1, wherein determining if the output of the parent region is compatible with the output of the current region of a cell comprises performing an automatic check.

4. The method according to claim 1, wherein the layout hierarchy from the input data and the layout hierarchy from the region data are determined using an inverse layout tree (ILT).

5. The method according to claim 4, further comprising:
    generating an empty ILT;
    for all parent regions, choosing a next parent region of a current region and adding a path from a current cell to a cell-instance of the current parent region in the ILT;
    checking if an ILT-node is a leaf and, if the ILT-node is a leaf, ending the recursion;
    if the ILT-node is not a leaf, selecting a next parent instance of the cell and checking if there is a corresponding branch in the current ILT-Node, and if there is a corresponding branch, recursively following the corresponding ILT branch; and
    if there is no corresponding branch in the current ILT-Node, generating an output of the promote containers of the current region in the parent instance.

6. The method according to claim 1, further comprising, after determining if the output of the parent region is compatible with the output of the current region for all parent regions, producing a dataset with content of an output of an output container.

7. The method according to claim 1, wherein ones of the steps are performed in parallel.

8. A method of making a semiconductor device, the method comprising:
    determining a layout for a semiconductor device, the determining comprising the steps of:
        for all parent regions, determining if an output of the parent region is compatible with an output of a current region of a cell, and
            when the output of the parent region is compatible with the output of the current region of a cell, reducing the output of the parent region taking into account the current region, or
            when the output of the parent region is not compatible with the output of the current region of a cell, copying an incompatible output of a sub-region to a promote container and promoting the incompatible output to an output of all other parent regions;
        generating a layout hierarchy from input data;
        generating a layout hierarchy from region data, wherein the layout hierarchy from the input data and the layout hierarchy from the region data are determined using an inverse layout tree (ILT);
        determining a difference between the layout hierarchy generated from the input data and the layout hierarchy generated from the region data;
        generating an empty ILT;
        for all parent regions, choosing a next parent region of a current region and adding a path from a current cell to a cell instance of the current parent region in the ILT;
        checking if an ILT-node is a leaf and, if the ILT-node is a leaf, ending the recursion;
        when the ILT-node is not a leaf, selecting a next parent instance of the cell and checking if there is a corresponding branch in the current ILT-Node, and if there is a corresponding branch, recursively following the corresponding ILT branch;

when there is no corresponding branch in the current ILT-Node, generating an output of the promote containers of the current region in the parent instance; and fabricating the device using the layout.

9. The method according to claim 8, wherein the semiconductor device comprises a DRAM memory chip.

10. The method according to claim 8, wherein the layout hierarchy from the input data is generated before the layout hierarchy from the region data.

11. The method according to claim 8, wherein determining if the output of the parent region is compatible with the output of the current region of a cell comprises performing an automatic check.

12. The method according to claim 8, further comprising, after determining if the output of the parent region is compatible with the output of the current region for all parent regions, producing a dataset with content of an output of an output container.

13. The method according to claim 8, wherein ones of the steps are performed in parallel.

14. A system for performing non-local geometric operations for design of a layout for a semiconductor device, the system comprising:

means for determining if an output of a parent region is compatible with an output of a current region of a cell;
   means for processing the output of the parent region according to the determination of compatibility;
   means for promoting an incompatible output to an output of all other parent regions;
   means for generating a layout hierarchy from input data;
   means for generating a layout hierarchy from region data, wherein the layout hierarchy from the input data and the layout hierarchy from the region data are determined using an inverse layout tree (ILT); and
   means for determining a difference between the layout hierarchy from the input data and the layout hierarchy from the region data;
   generating an empty ILT;
   means for choosing a next parent region of a current region for all parent regions, and adding a path from a current cell to a cell instance of the current parent region in the ILT;
   means for checking if an ILT-node is a leaf and, if the ILT-node is a leaf, ending the recursion;
   means for, when the ILT-node is not a leaf, selecting a next parent instance of the cell and checking if there is a corresponding branch in the current ILT-Node, and if there is a corresponding branch, recursively following the corresponding ILT branch; and
   means for, when there is no corresponding branch in the current ILT-Node, generating an output of the promote containers of the current region in the parent instance.

* * * * *